United States Patent [19]
Dinh et al.

[11] Patent Number: 6,019,913
[45] Date of Patent: Feb. 1, 2000

[54] LOW WORK FUNCTION, STABLE COMPOUND CLUSTERS AND GENERATION PROCESS

[75] Inventors: Long N. Dinh, Concord; Mehdi Balooch, Berkeley; Marcus A. Schildbach; Alex V. Hamza, both of Livermore; William McLean, II, Oakland, all of Calif.

[73] Assignee: The Regents of the University of California, Oakland, Calif.

[21] Appl. No.: 09/080,110

[22] Filed: May 18, 1998

[51] Int. Cl.$^7$ .................................................. H01J 9/02
[52] U.S. Cl. ................... 252/516; 252/518.1; 252/521.3; 445/51
[58] Field of Search ............................... 313/311; 445/51, 445/50; 427/77, 78; 252/500, 518.1, 516, 521.3

[56] References Cited

U.S. PATENT DOCUMENTS 4,568,853  2/1986  Boutot .............................. 313/105 CM
5,666,025  9/1997  Geis et al. .......................... 313/346 R

*Primary Examiner*—Kenneth J. Ramsey
*Attorney, Agent, or Firm*—L. E. Carnahan

[57] ABSTRACT

Low work function, stable compound clusters are generated by co-evaporation of a solid semiconductor (i.e., Si) and alkali metal (i.e., Cs) elements in an oxygen environment. The compound clusters are easily patterned during deposition on substrate surfaces using a conventional photo-resist technique. The cluster size distribution is narrow, with a peak range of angstroms to nanometers depending on the oxygen pressure and the Si source temperature. Tests have shown that compound clusters when deposited on a carbon substrate contain the desired low work function property and are stable up to 600° C. Using the patterned cluster containing plate as a cathode baseplate and a faceplate covered with phosphor as an anode, one can apply a positive bias to the faceplate to easily extract electrons and obtain illumination.

19 Claims, 1 Drawing Sheet

LOW WORK FUNCTION, STABLE COMPOUND CLUSTERS AND GENERATION PROCESS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to electron emission, particularly to patterned electron emitting devices, and more particularly to low work function, stable compound cluster generation and the patterned deposition thereof on surfaces whereby extraction of electrons and obtaining illumination is easily accomplished.

Visual displays of various types are being widely utilized. A considerable fraction of the total energy consumption in the United States and other technically advanced countries is spent in powering visual displays, such as televisions and computer monitors. Flat panel displays are increasing in popularity since they are light and small, and are becoming an integral part of visual displays, particularly since they are less bulky than conventional cathode ray tubes (CRTs). Liquid crystal displays are commercially available and are mainly used for portable computers. The disadvantages of the liquid crystal display include high energy consumption, high cost of production, low intensity, and difficulties associated with large diameter display production. Among a few alternatives to this technology is the field emission display. This type of display relies on the emission of electrons from an array usually made up of sharp tips. The ease of electron emission, and therefore the amount of energy consumed by the display, depends on the work function of the emitter material and the sharpness of the tips. The work function of a material is defined as the minimum energy needed to remove an electron from a material to a point at an infinite distance away outside the material's surface. The production of sharp tips and reliable low work function materials has not been achieved successfully and substantial effort has been directed to this problem. A low work function is considered to be <3.5 electron-volts (eV). Recently, a process and apparatus have been developed which enables the deposition of low work function material on the field-emission tips and which is described and claimed in co-pending U.S. application Ser. No. 09/080,109, filed May 18, 1998, entitled "Low Work Function Surface Layers Produced by Laser Ablation Using Short-Wavelength Photons," assigned to the same assignee.

The present invention provides an alternative to the sharp tip electron-emission devices. The invention involves the production of compound clusters with small radius having low work function, which enables efficient electron-emission and illumination with low energy consumption and ease of fabrication. The low work function, stable silicon-based compound cluster generation, and their patterned deposition on surfaces enable their use, for example, as cathode material for field emission flat panel displays, electron guns, and cold cathode electron guns. The low work function compound clusters are produced by co-evaporation of solid semiconductor (i.e., Si) and alkali metal (i.e., Cs) elements in an oxygen environment, and can be easily patterned during cluster film deposition.

SUMMARY OF THE INVENTION

It is an object of the present invention to provide low work function compound clusters for field emission devices.

A further object of the invention is to provide a process for producing low work function compound clusters.

A further object of the invention is to produce compound clusters having low work function by co-evaporation of solid semiconductor and alkali metal elements in an oxygen environment.

Another object of the invention is to provide low work function, stable compound cluster generation, and their patterned deposition on surfaces.

Another object of the invention is to provide low work function clusters formed by co-evaporation of silicon and an alkali metal in an oxygen buffer gas.

Another object of the invention is to provide a low work function, stable silicon-based compound clusters utilizing a process wherein evaporated Si atoms coalesce and react with oxygen and an alkali metal to produce compound clusters.

Another object of the invention is to provide a process for producing compound clusters, such as Si/Cs/O, on a patterned deposition surface.

Another object of the invention is to provide patterned compound clusters deposited on a substrate having the capability to function as cathode material for field emission devices, such as flat panel displays, electron guns, and cold cathode electron guns.

Another object of the invention is to provide silicon-based compound clusters which are stable up to about 600° C., have a low work function property, and which are easily patterned during cluster film deposition.

Other objects and advantages of the present invention will become apparent from the following description and accompanying drawings. Basically, the invention involves low work function, stable compound cluster generation, and their patterned deposition on surfaces. Compound clusters having low work function can be produced by the apparatus and process of the present invention, which involves co-evaporation of solid semiconductor and alkali metal elements in an oxygen environment. The cluster size distribution is narrow, with a peak range of angstroms to nanometers, depending on oxygen pressure and the semiconductor source temperature. Compound clusters composed of Si/Cs/O deposited on a carbon substrate have been shown to have a low work function property by ultraviolet photoelectron spectroscopy (UPS), are stable up to 600° C. as measured by x-ray photoelectron spectroscopy (XPS), and for certain size range and chemical composition, negative electron affinity (NEA) was detected even after annealing to 600° C. Also, by an easily patterned technique of compound cluster film deposition, it has been demonstrated that the compound clusters can easily be deposited in a desired pattern. Using a patterned plate containing the compound clusters as a cathode baseplate and a faceplate covered with phosphor as an anode, application of a positive bias to the faceplate easily extracts electrons and obtains illumination. Thus, the patterned compound clusters of this invention may be effectively utilized, for example, as cathode material for field emission flat panel displays, electron guns, and cold cathode electron guns. The production of compound clusters with small radius having low work function meet the above-referenced challenges regarding visual displays, wherein such have low energy consumption, low cost of production, high intensity, and reduce the prior difficulties associated with large diameter display production, thereby advancing the state of the visual display technology.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Figure 1:
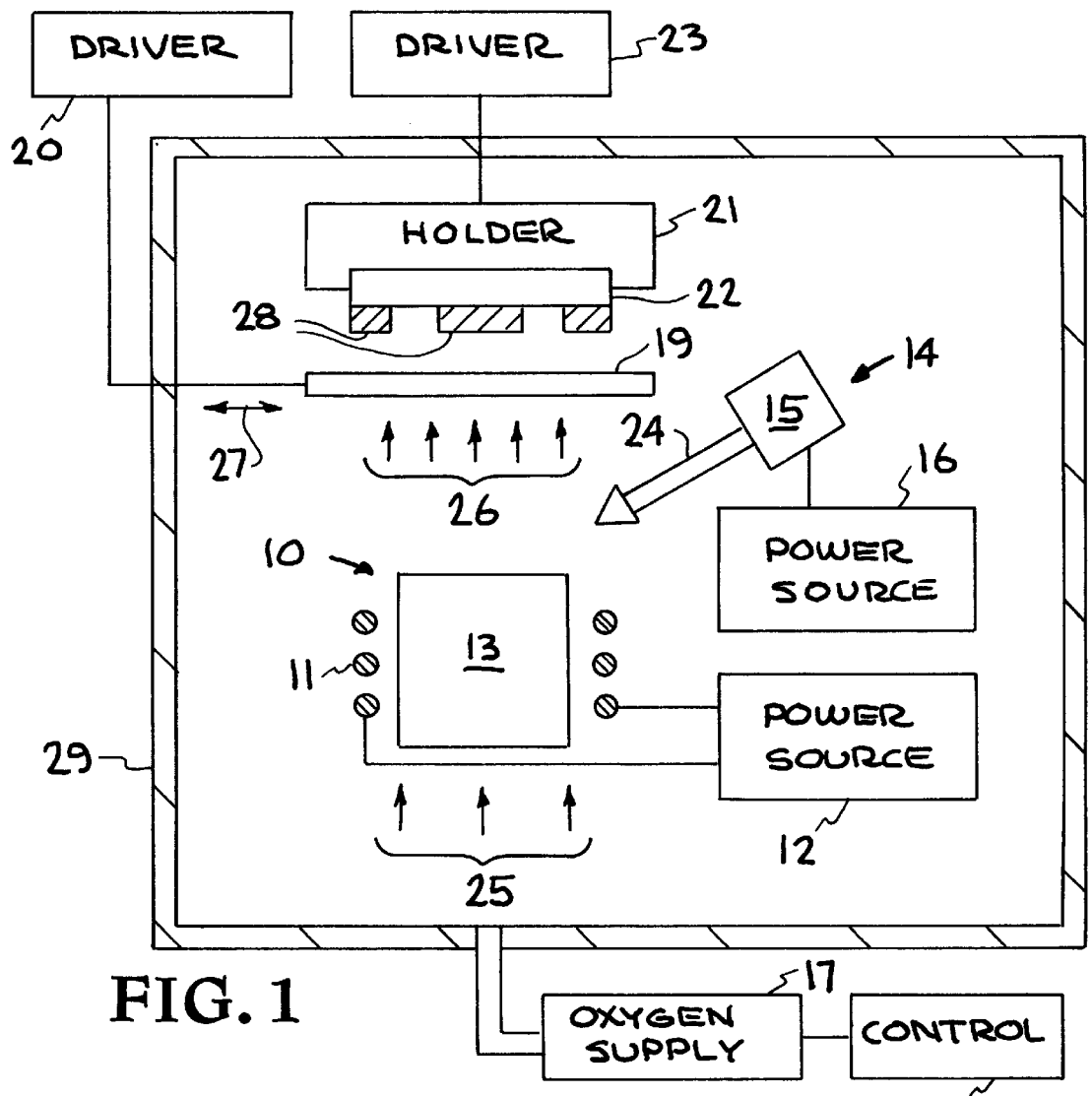
FIG. 1 schematically illustrates an embodiment of an apparatus for generation of low work function compound clusters in accordance with the present invention.

The present invention involves low work function, stable compound cluster generation, and patterned deposition thereof on surfaces. Compound clusters having low work function have been produced by co-evaporation of solid semiconductor and alkali metal elements in an oxygen environment. The cluster size distribution is narrow, with a peak range of angstroms to nanometers (10Å to 10 nm) depending on oxygen pressure ($10^{-4}$ Torr to $10^{-1}$ Torr) and solid semiconductor source temperature. While the experimental verification tests utilized silicon (Si) as the solid semiconductor, other materials, such as Ge, GaAs, SiC and other semiconductors, could be used; and while the alkali metal used in the verification tests was cesium (Cs), other alkali metals, such as K, Li, Rb, Fr, and Na may be used. Compound clusters composed of Si/Cs/O deposited on a graphite substrate in accordance with the present invention were tested for low work function properties' stability, negative electron affinity, and patterning capability. The low work function property of the clusters was determined by ultraviolet photoelectron spectroscopy (UPS). The clusters are stable up to 600° C., as measured by x-ray photoelectron spectroscopy (XPS). For a certain combination of cluster size range (1 nm to 6 nm) and chemical composition (i.e., Cs concentration >10%) negative electron affinity (NEA) was detected even after annealing to 600° C. by UPS and electron emission microscopy (FEEM). Testing established that a patterned compound cluster film can be easily obtained by using a conventional photo-resist technique. Thus, the patterned, low work function, and stable compound clusters of this invention may be utilized effectively in applications such as cathode material for field emission flat panel displays, electron guns, and cold cathode electron guns. The compound clusters with small radius having low work function, enable low energy consumption, low cost of production, high intensity, and reduce difficulties associated with large diameter display production, and thus provide a significant advance in the field of visual displays.

The low work function compound clusters of the present invention are formed by co-evaporation, for example, of silicon (Si) and an alkali metal, such as cesium (Cs), in an oxygen buffer gas. The Si source may be a heated boat positioned in line-of-sight of the substrate. The Si source may also be an excimer laser. An alkali metal dispenser directed at the Si source provides alkali metal atoms. The dispenser may be a holder connected to a power supply. The evaporated Si atoms coalesce and react with the oxygen and the alkali metal atoms to produce compound clusters composed of Si/Cs/O. The oxygen background gas is maintained at a fixed pressure in the range of $10^{-4}$ Torr to $10^{-1}$ Torr. The thus-produced compound clusters can be transported toward a target or substrate by convection for the purpose of film deposition. The film that is formed on the target or substrate, therefore, consists of an ensemble of compound clusters. A patterned film of compound clusters can be readily obtained by using on the target or substrate a conventional photo-resist technique where the clusters form only on openings or bias in the photo-resist, as known in the art.

FIG. 1 schematically illustrates the low work function, compound cluster generation and deposition, and apparatus for carrying out the process. As shown schematically, the process is carried out in a deposition chamber that is originally evacuated to $10^{-8}$ Torr. The apparatus, as shown in FIG. 1, comprises a silicon source including an Si evaporator 10 comprising a coil 11 and a power supply 12, and a silicon boat 13; a Cs dispenser 14 directed at the Si source and consisting of an alkali metal holder 15 and a power supply 16; an oxygen supply 17 and oxygen control means 18; a mechanical shutter 19 having an actuator or driver 20; and target, substrate, or sample holder 21 containing a patterned sample 22, and having a drive mechanism 23, whereby the target can at least be rotated, if desired. Note that Si boat 13 is positioned in line-of-sight of the sample 22.

In operation, the Si boat 13 is heated to a temperature in the range of 1500° C. to 2000° C. by evaporator 10 to produce Si atoms, by evaporation, Cs dispenser 14 is activated to produce Cs atoms at a rate of $10^{15}$–$10^{17}$ atoms/sec. over a 5 mm long opening slit on the dispenser indicated by arrow 24, and oxygen supply 17 is activated to produce an oxygen flow indicated by arrows 25 at a rate of flow or background gas of oxygen resulting in $10^{-4}$ Torr to $10^{-1}$ Torr of oxygen prior to turning on the Si or the Cs sources; whereby Si atoms, at a vapor pressure in the range of $10^{-3}$–$10^{0}$ Torr, coalesce and react with the oxygen and the Cs atoms to produce Si/Cs/O compound clusters indicated by arrows 26, which are transported by convection toward the patterned target, substrate, or sample 22, and pass through the mechanical shutter 19, which can be moved in a linear direction as indicated by arrow 27, or in a rotational motion, by driver 19, whereby the compound clusters 26 are deposited of the patterned surfaces 28 of sample or substrate 22. Thus a patterned substrate containing Si/Cs/O compound clusters is produced within deposition chamber 29, and which can be utilized, as described above or as in FIG. 2, described hereinafter. After deposition, the photo-resist utilized to pattern the surfaces 28 can be washed away.

Figure 2:
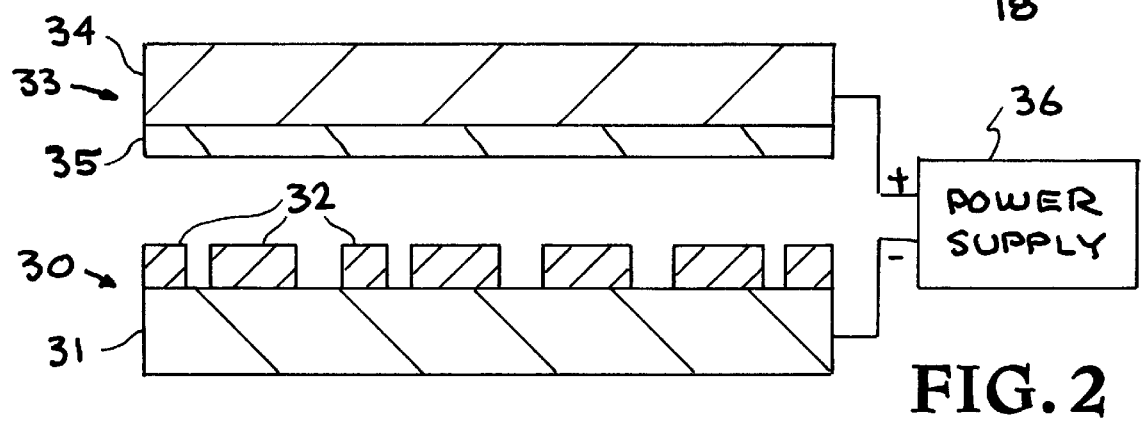
FIG. 2 illustrates an arrangement using the patterned compound clusters as a cathode, whereby appropriate application of an electrical bias easily extracts electrons and obtains illumination.

As shown in FIG. 2, the patterned substrate, produced as described above, may be used as a cathode baseplate 30 composed of a substrate 31 and patterned Si/Cs/O compound cluster films 32, and a faceplate 33 composed of a substrate 34 covered with a phosphor layer 35 is used as an anode. By connecting the baseplate 30 and faceplate 33 to a power supply 36, and applying a positive bias to the faceplate 33, electrons can be easily extracted from the compound cluster films 32 and illumination on the phosphor layer 35 obtained. The patterned compound cluster films 32 usually have clusters in the size range of 1 nm to 6 nm, depending on the Si evaporation temperature and/or the oxygen pressure.

If the Si source temperature was increased to 2000° C. and the oxygen pressure increased to $10^{-1}$ Torr, the size distribution of the compound clusters would increase to about $\geq 10$ nm.

While the invention was experimentally verified by producing Si/Cs/O compound clusters, other clusters composed of semiconductor/alkali metal/oxygen may be produced. It is understood that the processing will vary depending on the materials involved in producing different clusters.

It has thus been shown that the present invention provides low work function, stable compound clusters that can be patterned during deposition on surfaces. The low work function, stable compound clusters are produced by co-evaporation of solid semiconductor and alkali metal elements, such as Si and Cs, in an oxygen environment. The cluster size distribution is dependent on oxygen pressure and Si source temperature, and the size distribution is narrow, with a peak range of angstroms to nanometers. Compound clusters of Si/Cs/O have been shown to be stable up to 600° C. with a work function in the range of $\leq 3.5$ eV or even NEA (the condition in which the vacuum level is below the conduction band in semiconductor and insulator). Patterning during deposition of the compound clusters can be easily carried using known techniques.

While particular embodiments of the compound clusters, deposition apparatus, operation sequence, materials, temperatures, parameters, etc., have been described or illustrated to exemplify and teach the principles of the invention, such are not intended to be limiting. Modifications and changes may become apparent to those skilled in the art, and it is intended that the invention be limited only by the scope of the appended claims.

The invention claimed is:

1. Compound clusters, comprising semiconductor material, an alkali metal, and oxygen.

2. The compound clusters of claim 1, deposited on a substrate.

3. The compound clusters of claim 1, wherein said semiconductor material is selected from the group consisting of Si, Ge, GaAs, SiC and other semiconductors; and wherein said alkali metal is selected from the group consisting of Cs, K, Li, Rb, Fr and Na.

4. The compound clusters of claim 1, having a size distribution with a peak range of angstroms to nanometers.

5. The compound clusters of claim 1, composed of silicon/cesium/oxygen, and having a size distribution of 10Å to 10 nm.

6. The compound clusters of claim 5, having a work function in the range of $\leq 3.5$ eV, and being stable at temperatures of up to about 600° C.

7. A process for producing compound clusters having low work function, comprising co-evaporation of solid semiconductor and alkali metal elements in an oxygen environment.

8. The process of claim 7, wherein the semiconductor elements are selected from the group consisting of Si, Ge, GaAs, and SiC; wherein the alkali metal elements are selected from the group consisting of Cs, K, Li, Rb, Fr and Na.

9. The process of claim 7, wherein the semiconductor and alkali metal elements are produced as atoms in a flow or a background gas of oxygen.

10. The process of claim 7, wherein the semiconductor elements are produced by heating a boat of solid semiconductor source to a temperature whereby atoms are evaporated from the source wherein the alkali metal elements are produced as atoms evaporated from a source and directed at the semiconductor source, and wherein a flow of oxygen is produced, whereby the evaporated semiconductor atoms coalesce and react with the oxygen and the alkali metal atoms to produce compound clusters.

11. The process of claim 7, additionally including providing a patterned substrate, and positioning the substrate such that the thus-produced compound clusters are deposited thereon to form patterned compound clusters on the substrate.

12. The process of claim 7, wherein the solid semiconductor and alkali metal elements are composed of silicon and cesium, and wherein the silicon elements are produced by heating a solid silicon source to a temperature in the range of 1500° C. to 2000°; wherein the cesium elements are produced by heating a cesium source to a temperature in the range of 700° C. to 1000° C.; and wherein a flow or a background gas of the oxygen is supplied, resulting in $10^{-4}$ Torr to $10^{-1}$ Torr of oxygen prior to turning on the Si or the Cs sources.

13. The process of claim 12, additionally including positioning the solid silicon source in line-of-sight with a substrate, whereby the thus-formed compound clusters are transported toward the substrate by at least convection for depositing a film thereof on the substrate.

14. The process of claim 13, additionally including patterning the substrate whereby deposition of the compound clusters on the substrate create patterned compound clusters on a surface of the substrate.

15. The process of claim 12, wherein the solid silicon source is in the form of a boat heated by an evaporator to produce evaporated silicon atoms, and wherein the cesium source is positioned in a dispenser mechanism whereby cesium atoms are evaporated therefrom.

16. The process of claim 15, wherein the compound clusters are formed with a size distribution in the range of about 10 angstroms to about 10 nanometers.

17. The process of claim 15, wherein the compound clusters have a size distribution determined by the oxygen pressure and the silicon source temperature.

18. The process of claim 7, additionally including controlling the size distribution of the compound clusters by controlling the pressure of the oxygen environment and the temperature of a source of the semiconductor elements.

19. The process of claim 7, additionally including providing a substrate positioned such that the thus-formed compound clusters are deposited on at least one region of the substrate.

* * * * *